United States Patent [19]

Awaya

[11] Patent Number: 4,783,781
[45] Date of Patent: Nov. 8, 1988

[54] SEMICONDUCTOR MEMORY DEVICE HAVING REDUNDANCY CONFIGURATION WITH READ CIRCUIT FOR DEFECTIVE MEMORY ADDRESS

[75] Inventor: Tomoharu Awaya, Yokohama, Japan

[73] Assignee: Fujitsu Limited, Kawasaki, Japan

[21] Appl. No.: 883,756

[22] Filed: Jul. 9, 1986

[30] Foreign Application Priority Data

Jul. 12, 1985 [JP] Japan .................. 60-153542

[51] Int. Cl.⁴ .............................................. G06F 11/20
[52] U.S. Cl. ................................... 371/10; 365/200
[58] Field of Search ................. 371/10, 11, 21, 24, 371/26; 365/200, 201

[56] References Cited

U.S. PATENT DOCUMENTS

| | | | |
|---|---|---|---|
| 4,583,179 | 4/1986 | Horii | 371/10 X |
| 4,592,024 | 5/1986 | Sakai | 371/10 X |
| 4,635,232 | 1/1987 | Iwahashi | 371/10 X |
| 4,656,609 | 4/1987 | Higuchi | 365/200 |

Primary Examiner—Jerry Smith
Assistant Examiner—Robert W. Beausoliel
Attorney, Agent, or Firm—Staas & Halsey

[57] ABSTRACT

A semiconductor memory device having a redundancy configuration including a read circuit for a defective memory address. The read circuit includes a transistor which forms a current switch circuit with a bipolar-transistor of an input buffer circuit. The base electrode of the transistor is connected to the output terminal of a PROM which stores a defective address. The reading operation is carried out by applying a voltage lower than a normally applied voltage to the base electrode of the bipolar-transistor and detecting the base current.

8 Claims, 6 Drawing Sheets

SEMICONDUCTOR MEMORY DEVICE HAVING REDUNDANCY CONFIGURATION WITH READ CIRCUIT FOR DEFECTIVE MEMORY ADDRESS

BACKGROUND OF THE INVENTION

1. Field of the Invention

The present invention relates to a semiconductor memory device having a redundancy configuration memory device such as a RAM. In particular, it relates to a read circuit for reading an address of a defective memory cell which is replaced with a redundancy memory cell.

2. Description of the Related Art

Recently, the capacity of a semiconductor memory device has tended to become larger and larger, but this increased capacity is accompanied by a higher probability of the occurrence of partial defects in the memory cells on a chip. Accordingly, a method whereby a defective memory is replaced with a redundant memory cell is carried out, to improve the manufacturing yield. This method is particularly utilized for MOS memory devices in which the enlargement of the capacity has gone a step further. This method, however, has not been widely utilized for bipolar-transistor type memory devices. Nevertheless, the necessity to adopt the redundant memory cell method has increased as the enlargement of the capacity in the bipolar-transistor memory device has progressed.

A semiconductor memory device having the redundancy configuration includes a Programmable Read Only Memory (PROM) which stores an address of the defective memory cell, a comparison circuit which compares an address signal input to the memory device with the content of the PROM, and a redundant memory cell which stores input data in place of the defective memory cell in response to a coincidence between signals determined by the comparison circuit.

The address of the defective memory cell is written into the PROM when the defective memory cell is found by a test procedure during the process of manufacturing the memory device.

As described above, the address of the defective memory cell is written into the PROM during the manufacture of the device. But, the content of the PROM often must be read out after manufacture of the memory device is completed to confirm that the redundant memory cell address was correctly written into the PROM, or whether the content written into the PROM has been changed due to heat engendered during the manufacturing process after a writing operation or a reliability test of the memory device.

It is impossible, however, to read out the content of the PROM by placing a probe in contact with the output terminal thereof, since the IC chip has a very high integration degree and therefore, a very small configuration. It is possible to form pads connected to output terminals of the PROM around the memory chip so as to read out the content of the PROM by placing the probe in contact with the pads. This method, however, involves the necessity of allowing space in which the pads can be formed, which reduces the integration degree of the IC.

In general, a large capacity memory device has a large number of address bits, and therefore, if exclusive pads or pins are needed for reading the defective cell address, the number of pads or pins must be the same as the number of input address bits. In practice, it is impossible to provide such a large number of exclusive pads or pins in the memory device. Further, after the chip has been housed in a package, it is impossible to carry out a reading operation.

SUMMARY OF THE INVENTION

Accordingly, an object of the present invention is to provide a semiconductor memory device having a redundancy configuration with a read circuit for a defective cell address, wherein the read circuit can read the defective cell address even if the memory device is housed in a package, without a decrease in the integration degree and without hindrance to the normal reading operation of the memory device, by a very simple means.

According to a fundamental aspect of the present invention, there is provided a semiconductor memory device having a redundancy configuration circuit, a read circuit, for a defective cell address comprising a programmable ROM for storing an address of a defective memory cell, a comparison circuit for comparing an input address signal and the content of the programmable ROM to detect an access to the defective memory cell, and a redundant memory cell accessed in place of the defective memory cell in response to the detection of the access to the defective memory cell by the comparison circuit. The semiconductor memory device also comprises an input-buffer circuit including a first bipolar-transistor to which an external input signal is input, and a second transistor connected to the first bipolar-transistor so as to form a current switch circuit. The base electrode of the second transistor is operatively connected to the output terminal of the programmable ROM, and a voltage at the base electrode of the second transistor is adjusted so that the second transistor is cut OFF during a normal operation of the memory device in relation to a voltage applied to the base electrode of the first bipolar-transistor during the normal operation of the memory device.

BRIEF DESCRIPTION OF THE DRAWINGS

Embodiments of a semiconductor memory device in accordance with the present invention will now be described with reference to the accompanying drawings, in which.

DESCRIPTION OF THE PREFERRED EMBODIMENTS

For a more comprehensive understanding of the present invention, a bipolar transistor type semiconductor memory device having a redundancy configuration to which the present invention is related, is first described with reference to FIGS. 1, 2, and 3. This kind of memory device is disclosed in U.S. patent application Ser. No. 788,587, and U.S. Pat. Nos. 4,744,060 and 4,745,582.

Figure 1:
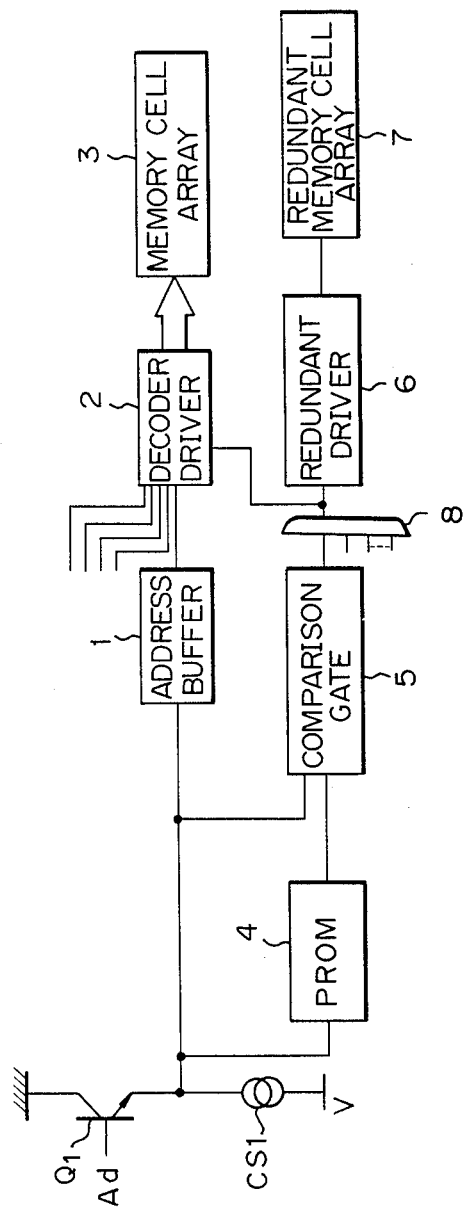
FIG. 1 is a block diagram of a related memory device.
Figure 2:
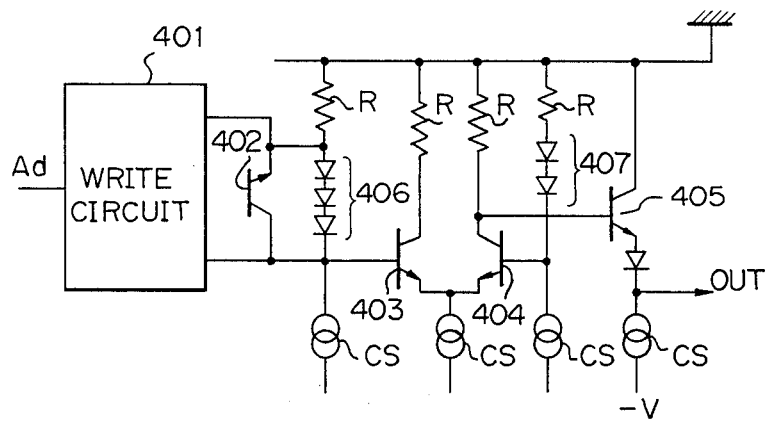
FIG. 2 is a circuit diagram of a PROM cell in FIG. 1.

FIG. 1 is a related art bipolar transistor type semiconductor memory device. In FIG. 1, Q1 is a bipolar-transistor, and CS1 is a constant current source connected in series with the transistor Q1. The transistor Q1 and the constant current source CS1 form an input buffer circuit for an address signal to the memory device. In addition, 1 is a word address buffer, 2 is a word decoder and driver, 3 is a normal memory cell array, 4 is a PROM cell for storing a bit of a defective cell address which was detected by a test during manufacture and written thereinto, 5 is a comparison gate for comparing a bit Ad of a word address signal ADW input to the memory device with the content of the PROM cell 4, 6 is a redundant word driver, 7 is a redundant memory cell array connected to redundant word lines, and 8 is an AND gate. The input word address signal ADW includes a plurality of bits, but, in FIG. 1, to simplify the drawing and the explanation, only one bit Ad is denoted. Also, the input buffer circuit formed by the transistor Q1 and the constant current source CS1, the address buffer 1, the PROM cell 4, and the comparison gate 5 are denoted in relation to one address bit Ad of the input address signal ADW. Accordingly, in practice, circuits including these components are provided in parallel corresponding to the number of bits of the input address signal ADW. Output signals from each address buffer 1 of the above-mentioned circuits are input in parallel to the decoder/driver 2, respectively, and outputs signals from each comparison gate 5 of above-mentioned circuits are input in parallel to the AND gate 8, respectively.

The mode of operation of the memory device in FIG. 1 will be explained below. The word address bit Ad input from a terminal pin of the memory device is applied to the address buffer 1 through the input buffer circuit formed by the transistor Q1 and current source CS1, and then input to the decoder/driver 2. As described above, in FIG. 1, the transistor Q1, the address buffer 1, the PROM cell 4, and the comparison gate 5, etc., are denoted for one address bit Ad, and residual bits of the address signal ADW are also input to the decoder/driver 2, respectively. The decoder/driver 2 selects one of the word lines of the memory cell array 3 and makes the selected word line "H" level in accordance with the input address signal ADW.

On the other hand, a bit address signal ADB is applied to a bit address buffer (not shown) at the same time as the application of the word address signal ADW, and accordingly, a pair of bit lines among the memory cell array 3 is selected by a bit decoder/driver (not shown). As a result, the read/write operation of the data to the memory cell connected to both the word line and the bit line pair selected as above-mentioned is carried out.

The address bit Ad is also input to the comparison gate 5, to be compared with the defective cell address bit from the PROM cell 4. When both address bits coincide the comparison gate 5 outputs an output signal to the AND gate 8, and when the bits do not coincide, the comparison gate 5 does not output an output signal. Therefore, if all bits of the address signal ADW do not coincide with all bits of the defective cell address, the AND gate 8 does not output an output signal to the decoder/driver 2. Thus, the decoder/driver 2 is allowed to carry out the aforementioned operation, and the operation of the redundant driver 6 is inhibited.

On the other hand, when the signal ADW coincides with the defective cell address, the AND gate 8 outputs the output signal to the decoder/driver 2 and the redundant driver 6, whereby operation of the decoder/driver 2 is inhibited. Thus, the decoder/driver 2 cannot select the word line of the defective memory cell, and the redundant driver 6 is operated to select the redundant memory cell in place of the defective memory cell.

As described above, when the defective memory cell is accessed, the redundant memory cell is accessed in place of the defective memory cell so as to carry out the normal memory access operation, and thus it is not always necessary to reject the memory chip even though it contains a defective memory cell.

To enable a better understanding of the device shown in FIG. 1, a circuit diagram and the operation thereof will be explained hereinafter with reference to FIGS. 2 and 3. FIG. 2 is a circuit diagram of the PROM cell 4. As shown in FIG. 2, the PROM 4 includes a write circuit 401, a transistor 402 for performing the writing opertion, two transistors 403 and 404 forming a differential amplifier, a transistor 405 forming an emitter follower output stage, three series connected diodes 406, two series connected diodes 407, resistors R, and constant current sources CS.

When a base-emitter junction of the transistor 402 is destroyed by the write circuit 401, the transistor 402 functions as one diode. On the other hand, when the base-emitter junction is not destroyed, the transistor 402 is always in an OFF state. When the transistor 402 is OFF, the base voltage of the transistor 403 drops through three diodes 406 from ground (a voltage drop by the resistor R is ignored here, and hereinafter), while the base voltage of the transistor 404 drops through two diodes 407. Accordingly, the latter voltage is higher than the former voltage. Thus, the transistor 404 becomes ON while the transistor 403 becomes OFF, and therefore, the output signal OUT becomes "L" level corresponding to logic "0" of the address bit.

On the other hand, when the base-emitter junction of the transistor 402 is destroyed, the base voltage of the transistor 403 drops by the emitter-collector voltage of the transistor 402 which corresponds to the voltage drop of one diode, while the base voltage of the transistor 404 drops by voltage drop of two diodes, and therefore, the former voltage is higher than the latter voltage. As a result, the transistor 403 is ON while the transistor 404 is OFF. Thus, the output signal OUT is made "H" level corresponding to logic "1" of the address bit. The PROM cell of FIG. 2 corresponds to one bit of the address signal ADW, and therefore, when the address signal ADW has n bits, n number of the PROM cells of FIG. 2 are provided.

Figure 3:
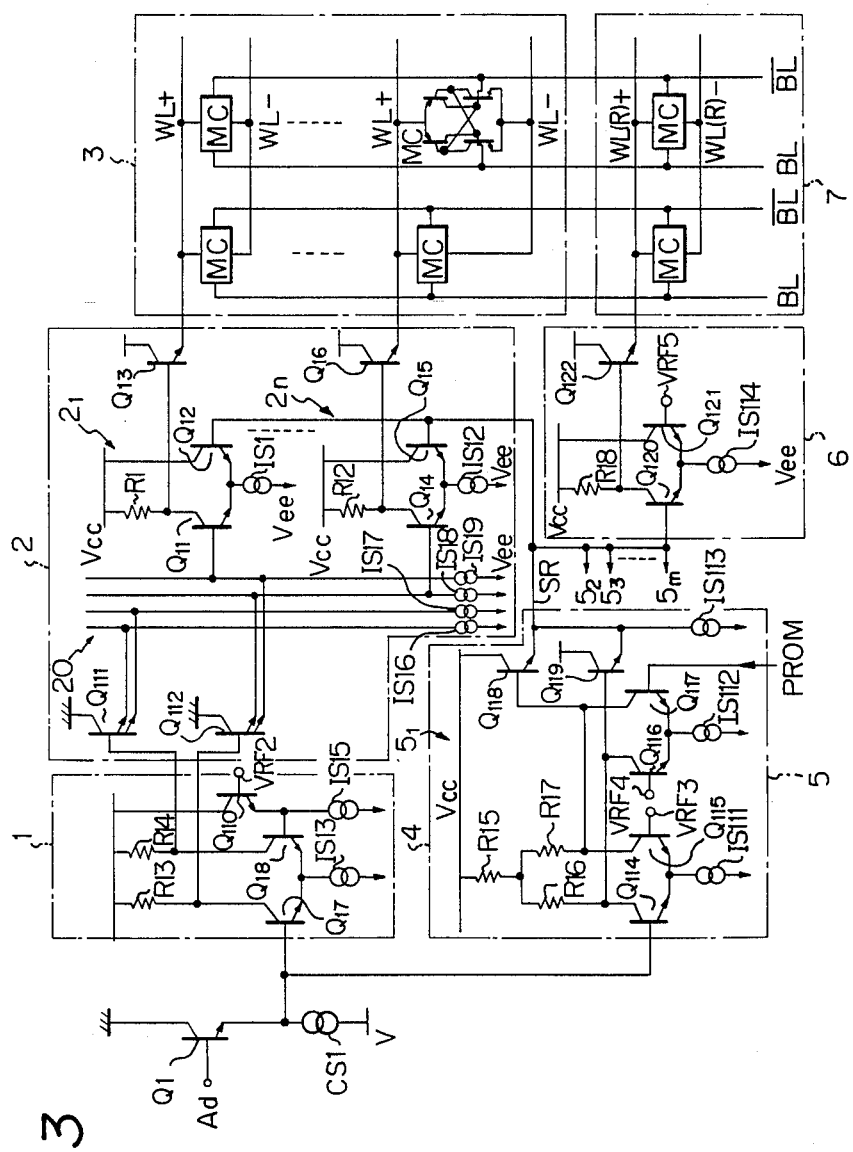
FIG. 3 is a circuit diagram of a memory device in FIG. 1.

FIG. 3 is a circuit diagram of FIG. 1. The mode of operation of the circuit of FIG. 3 will be described below. First, the read and write operations in the normal state will be described. In this case, the word address ADW is applied to the word address buffer 1, while the bit address is applied to the bit address buffer (not shown). Each of the address buffer units outputs a high level and low level signal to a signal line of the decoder line 20 via the multi-emitter transistor Q111 and Q112, etc., in accordance with the level of each bit of the word address ADW. The signal lines of the decoder line 20 are connected to the plural number of multi-emitter transistors. If one or more of the output signals of the multi-emitter transistors is a high level, the voltage level on the signal line becomes a high level.

When, for example, the signal line connected to the base of the input transistor Q11 of the word driver unit $2_1$ becomes low level, the word driver unit $2_1$ outputs a high level word line selection signal to the high voltage word line WL+. Thus, the word line is selected. Further, a pair of bit lines BL and $\overline{BL}$ are selected by the bit decoder, etc. (not shown). Thus, the read and write operations of data for the memory cell MC connected to the word line and a pair of the bit lines selected as described above, are carried out.

The mode of operation of the redundancy circuit portion will now be described.

The comparison gate unit $5_1$ forms an exclusive OR circuit. Therefore, if the address bit Ad input to the unit $5_1$ and the defective address signal from the PROM are both high level or both low level, the unit $5_1$ outputs a low level selection signal SR. On the other hand, if one of them is high level while the other is low level, the unit $5_1$ outputs a high level selection signal SR.

In more detail, when the 114 address bit Ad is high level, the transistor Q114 becomes ON while the transistor Q115 becomes OFF. Thus, the base voltage of the output transistor Q119 becomes low level. At this time, if the defective word address signal output from the PROM to the base of the transistor Q117 is high level, the transistor Q117 becomes ON while the transistor Q116 becomes OFF. Thus, the base voltage of the output transistor Q118 becomes low level. As a result, the selection signal SR becomes low level.

When the address bit Ad is high level and the defective address bit is low level, the transistor Q117 becomes OFF and the transistor Q116 becomes ON. Thus, the base voltage of the output transistor Q119 becomes low level and the base voltage of the output transistor Q118 becomes high level. Accordingly, the selection signal SR becomes high level.

When the word address bit Ad is low level, the transistor Q114 becomes OFF and the transistor Q115 becomes ON. Thus, the base voltage of the output transistor Q118 becomes low level. At this time, if the defective address bit is low level, the transistor Q117 becomes OFF and the transistor Q116 becomes ON. Thus, the base voltage of the output transistor Q119 becomes low level so that the selection signal SR becomes low level.

When the address bit Ad is low level and the defective word address signal is high level, the base voltage of the output transistor Q118 becomes low level while the base voltage of the output transistor Q119 becomes high level. Thus, the selection signal SR becomes high level. As described above, the comparison gate unit $5_1$ executes an exclusive logical add operation on the word address bit Ad and the defective address bit from the PROM cell.

Figure 4:
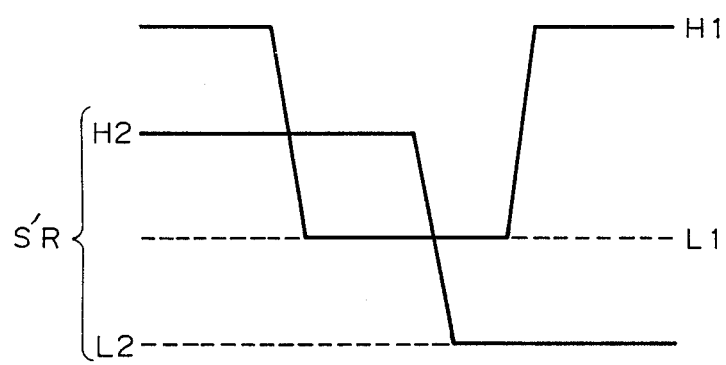
FIG. 4 is a timing diagram of the voltage levels of the signals at various points in the memory device of FIG. 3.

FIG. 4 is a graph of the relationship between the signal level of the selection signal SR output from the comparison gate 5 and the signal level of the input signal to the word driver. In FIG. 4, H1 and L1 indicate high and low logical levels of the input signal to the word driver 2, respectively. H2 and L2 indicate high and low levels of the selection signal SR, respectively. As is clear from FIG. 4, the high and low levels H2 and L2 of the selection signal SR are shifted toward the low voltage side in comparison with the high and low levels H1 and L1 of the input signal. That is, the high level H2 of the selection signal SR is between the high and low levels H1 and L1 of the input signal, and the low level L2 is lower than the low level L1. Further, the reference voltage VRF5 applied to the base of the transistor Q121 is between the high voltage level H2 and the low voltage level L2 of the selection signal SR.

In the circuit of FIG. 3, when the word address ADW does not coincide with a defective word address (i.e., when the selection signal SR is high level H2), the output signal of the redundancy word driver 11 becomes low level. Thus, the high voltage redundancy word line WL(R)+ of the redundancy memory cell array 7 becomes low level and the redundancy memory cell array 7 becomes a non-selection state. In this case, the selection signal SR is utilized as the reference voltage of each word driver unit of the word driver 2, and the read and write operations of the data described before are carried out.

On the other hand, when the word address ADW coincides with the defective word address from the PROM, all output signals of the comparison gate unit $5_1$ to $5_m$ (corresponding to bits of the word address), become entirely low level. Thus, the selection signal SR becomes low level. In this case, the low voltage level L2 of the selection signal SR becomes lower than the low voltage level L1 of the logical signal input to each word driver unit of the driver 2, as described before. Accordingly, when the word address ADW indicates a defective circuit portion, the selection signal SR becomes the lowest voltage level L2. Thus, the transistors Q12 and Q15, etc., of each word driver unit become OFF while the transistors Q11 and Q14, etc. become ON, so the voltages of all high voltage word lines WL+ become low level, i.e., the non-selection state. At this time, in the redundancy word driver 6, the transistor Q120 becomes OFF while the transistor Q121 becomes ON. Thus, the redundancy word line WL(R)+ becomes high level and the redundancy memory cell array 7 is selected. In such a manner, the redundancy memory cell array 7 is accessed in place of the defective word address portion of the memory cell array 7. In addition, when the word address ADW does not coincide with the defective word address stored in the PROM, the selection signal SR becomes high level H2, as described before. Thus, the output signal of the redundancy word driver 6 becomes low level and the redundancy memory cell array 7 enters the non-selection state.

A preferred embodiment of the present invention will now be explained with reference to FIGS. 4 to 8. FIG. 4 is a embodiment of a memory device according to the present invention. In FIG. 4, components carrying the same reference numerals as shown in FIG. 1 are the same components having the same function. As clear from FIGS. 1 and 4, the difference between the device of FIG. 1 and the device of FIG. 4 is transistor Q2 which, together with the transistor Q1 of the input buffer circuit, forms a current switch circuit.

The output terminal of the PROM cell 4 is connected to a base electrode of the transistor Q2 via the diode D1, which is maintained ON by a current source CS2 so as to produce a forward voltage drop of one diode thereacross. The collector electrode of the transistor Q2 is connected to a power supply (in this example, ground), and the emitter thereof is connected to the output terminal of the input buffer circuit, i.e., the emitter electrode of the transistor Q1, via the diode D2. Further, a capacitor C is connected between the base electrode of the transistor Q2 and ground.

The diodes D1 and D2 are provided for adjusting the voltage level of the base electrode of the transistor Q2 in relation to the base voltage of the transistor Q1. These diodes may be omitted according to circumstances, as will be explained later in detail.

The capacitor C is provided to prevent an erroneous operation of the memory device. That is, during the operation of the memory device, the address bit Ad varies at every moment, so that the output voltage of the input buffer circuit randomly varies between "H" level and "L" level. Since parasitic capacitors exist between the anode and cathode electrodes of the diode D2, the emitter and base electrodes of the transistor Q2, and the anode and cathode electrodes of the diode D1, respectively, in the reverse biased direction, the voltage variation at the output terminal of the input buffer circuit is transmitted to the output terminal of the PROM cell 4 through these capacitors. As a result, it is possible that the comparison gate 5 will operate erroneously. If, however, the base electrode of the transistor Q2 is grounded through the capacitor C, such an erroneous operation will be prevented since the above-mentioned voltage variation is grounded through the capacitor C.

Figure 5:
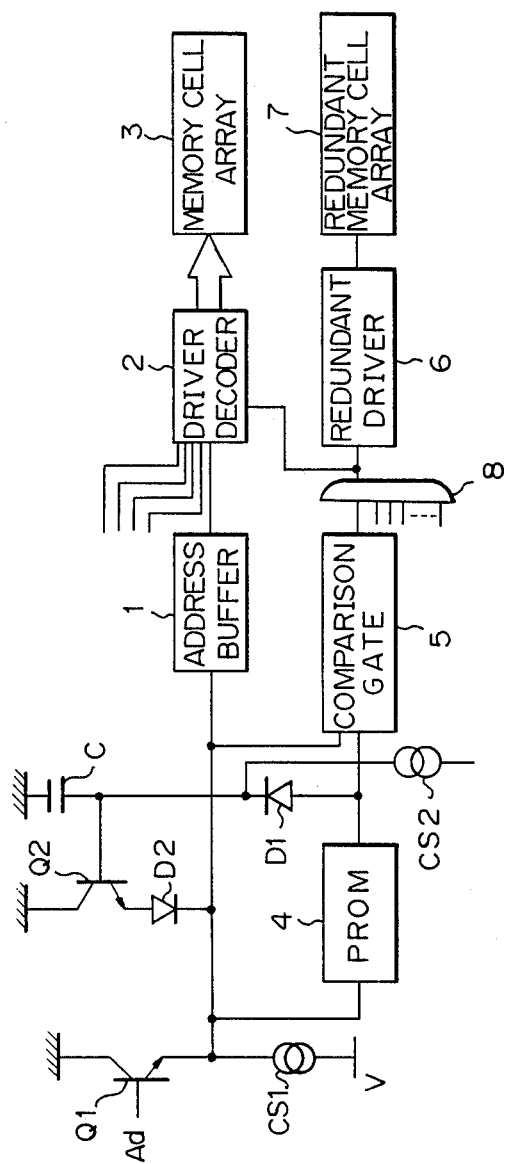
FIG. 5 is a block diagram of a memory device according to the present invention.

FIG. 5 is a fundamental structure of the read circuit for reading the content of the PROM cell 4, in which additional components such as the capacitor C and diodes D1 and D2 are omitted. In FIG. 5, the constant current sources CS is formed by a transistor Q3, wherein a reference voltage $V_R$ is applied to the base electrode thereof, and a resistor R1.

The mode of operation of the read circuit shown in FIG. 5 will be described with reference to FIG. 6 which shows a relationship of the voltage levels between the output voltage of the PROM cell 4 shown by ① and the base voltage of the transistor Q1 shown by ②. The address bit Ad normally assumes approximately −0.8 V when at an "H" level corresponding to "1", and assumes −1.8 V when at an "L" level corresponding to "0". On the other hand, the PROM cell 4 is adjusted so that the output voltage thereof becomes −2.5 V at the "H" level, and −3.5 V at the "L" level. This level adjustment can be easily carried out by varying the number of diodes connected in series with the output transistor 405 of the PROM cell 4 shown in FIG. 2.

When the voltage levels of the base electrodes of transistors Q1 and Q2 are adjusted as described above, the base voltage ① of the transistor Q2, i.e., the output voltage ① of the PROM cell 4, is lower than the base voltage ② of the transistor Q1 at the normal operation mode, wherein the reading operation of defective cell address is not carried out, regardless of whether the address bit Ad is "H" or "L". Accordingly, the transistor Q1 is always ON and the transistor Q2 is always OFF, which is the same state as when a read circuit is not provided. As a result, the address bit Ad input to the address buffer 1 is not influenced due to erroneous operation of the transistor Q2 by the output signal of the PROM cell 4. Accordingly, the normal memory access operation described above in FIG. 1 is assured.

Figure 6:
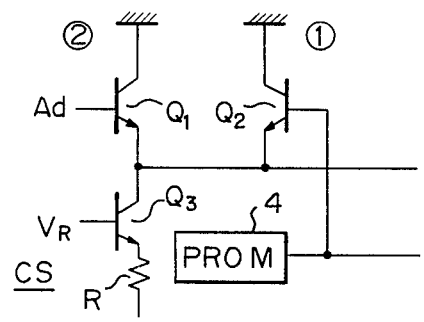
FIG. 6 is a circuit diagram of a read circuit.
Figure 7:
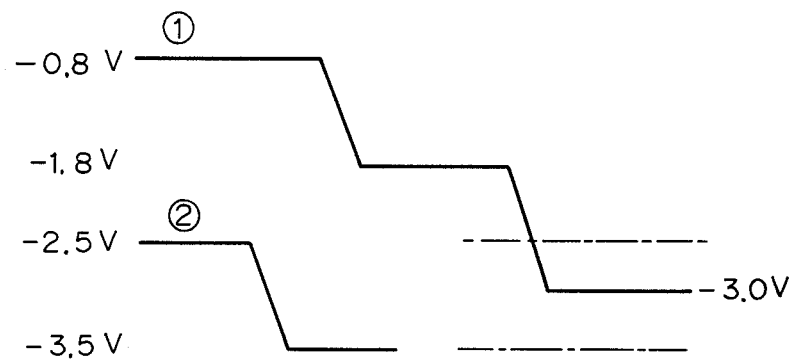
FIG. 7 is a graph of the relationship between base voltages of the transistors Q1 and Q2 in FIG. 6.

When the content of the PROM cell 4 is read out to the outside of the memory device, the base voltage of the transistor Q1 is further lowered so as to assume an intermediate voltage of −3.0 V, (i.e., between the "H" and "L" level output voltages of the PROM cell 4 as shown in FIG. 6). Namely, the reading voltage −3.0 V, which is lower than the voltage of the address bit Ad, is applied to the input terminal pin (not shown) instead of the address bit Ad. Accordingly, when the content of the PROM cell 4 is "1" and has the voltage of −2.5 V, the base voltage ② of the transistor Q1 beomes lower than the base voltage ① of the transistor Q2, so that the transistor Q1 becomes OFF while the transistor Q2 becomes ON.

As a result, since the transistor has the base current in an ON state but does not have the base current in an OFF state, it is judged that the content of the PROM cell 4 is "1" by detecting that no base current flows through the transistor Q1. On the other hand, when the content of the PROM cell 4 is "0" and has the voltage of −3.5 V, the transistor Q1 becomes ON while the transistor Q2 becomes OFF, since the base voltage ② of the transistor Q2 is higher than the base voltage ① of the transistor Q1.

In conclusion, when the base voltage ② of the transistor Q1 is −3.0 V, if the base current of the transistor Q1 flows the content of the PROM cell 4 is "0", and if no base current flows, the content is "1". As described above, the content of the PROM is easily read out by utilizing the address pins of the memory device.

The normal operation of the read circuit may be confirmed by determining that the transistor Q1 becomes OFF and the transistor Q2 becomes ON when the base voltage ② of the transistor Q1 is made to be lower than −3.5 V. In general, however, it is sufficient to carry out the reading operation with the application of the intermediate level voltage (−3.0 V) between the "H" and "L" output voltages of the PROM cell 4, without carrying out the above-mentioned confirmation.

The base voltage ② of the transistor Q1, which is applied to the address pin of the memory device, should be set at a suitable voltage, since when the base voltage ② becomes too low, the constant current sources CS1 of the input buffer, etc., do not operate. Although, in such a case, if the power supply voltage is at a further lower voltage at the reading time, the constant current source may then operate.

When level shift diodes D1 and D2 are provided as shown in FIG. 4, the output voltage of the PROM cell 4 may fall by the amount across two diodes to coincide with the voltage level of the address bit Ad. Accordingly, even if the "H" and "L" output voltages of the PROM 4 are −0.8 V and −1.8 V, respectively, the relationship between the base voltages of the transistors Q1 and Q2 as shown in FIG. 6 is realized. Therefore, it is not necessary for the PROM cell 4 to have an especially low "H" and "L" output voltage. This is convenient for the comparison circuit 5.

Figure 8:
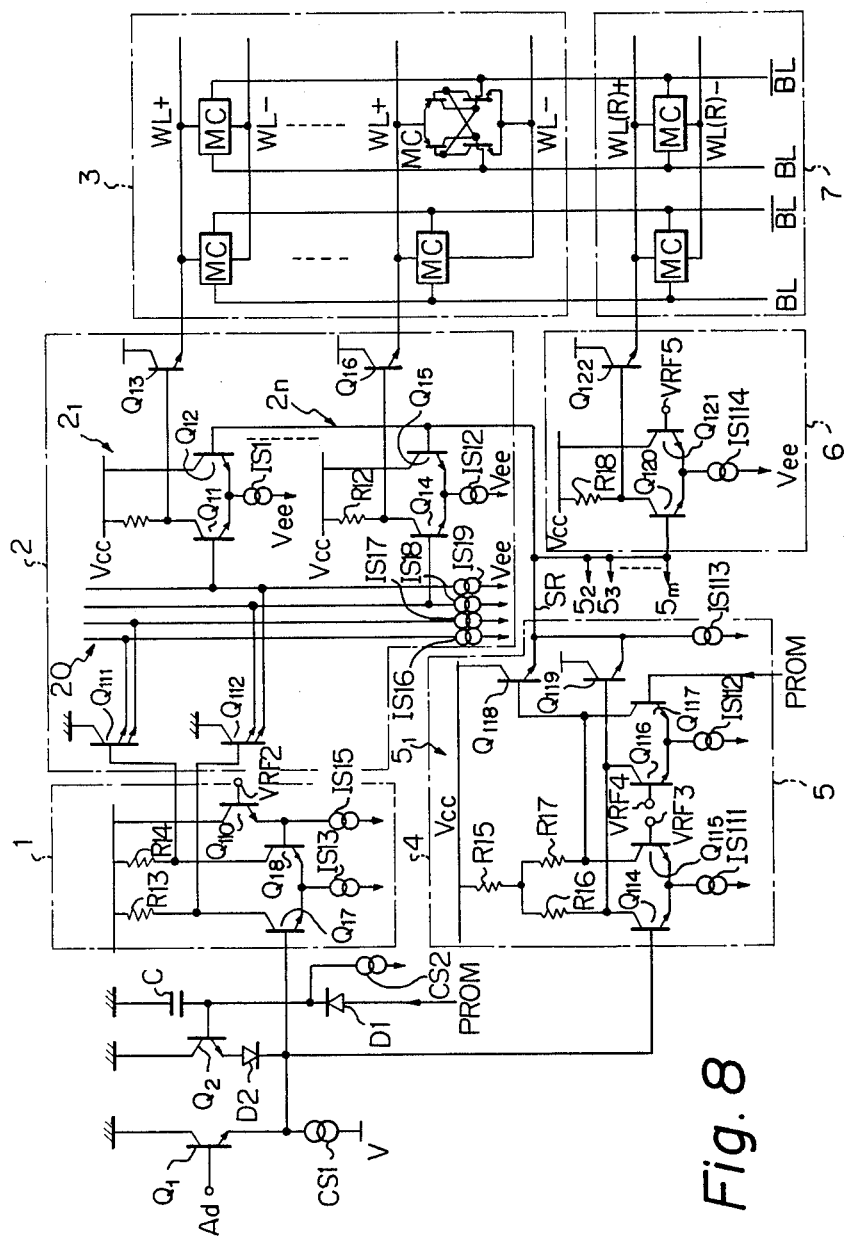
FIG. 8 is a circuit diagram of the device of FIG. 5.

FIG. 8 is a detailed circuit diagram of the memory device of FIG. 5. The fundamental operation of this circuit is the same as that explained with reference to FIGS. 3, 5 and 6.

As described above, according to the present invention, the defective cell address may be read out from the PROM by utilizing the address terminal pins with the addition of very little circuitry.

I claim:

1. A semiconductor memory device having a redundancy configuration, comprising:
   a first power supply line;
   a second power supply line having a lower voltage than that of said first power supply line;
   an input-buffer circuit including:
   an input terminal operatively connected to receive an input address signal;
   a first bipolar-transistor having a base operatively connected to said input terminal, a collector operatively connected to said first power supply line, and an emitter; and a constant current source operatively connected between the emitter of said first bipolar-transistor and said second power supply line;

decoder means, operatively connected to said emitter of said first bipolar-transistor, for receiving the input address signal and decoding the input address signal;

a memory cell array operatively connected to said decoder means;

a programmable ROM for storing an address of a defective memory cell in said memory cell array, and having an output terminal for outputting the address of the defective memory cell;

a comparison circuit, operatively connected to the output terminal of said programmable ROM and to said input terminal of said input-buffer circuit, for comparing the address of the defective memory cell and the input address signal and for detecting an access to the defective memory cell;

a redundancy memory cell, operatively connected to said comparison circuit, accessed in place of the defective memory cell in response to the detection of the access to the defective memory cell by said comparison circuit; and a second bipolar-transistor having a base operatively connected to said output terminal of said programmable ROM, having a collector operatively connected to said first power supply line, and having an emitter operatively connected to the emitter of said first bipolar-transistor, said first bipolar-transistor, said second bipolar-transistor and said constant current source forming a current switch circuit, a voltage on the base of said second bipolar-transistor being adjusted with respect to a voltage of the input address signal applied to the base of said first bipolar-transistor during a normal operation such that said second bipolar-transistor is turned OFF regardless of the input address signal, and the voltage on the base of said second bipolar-transistor being adjusted with respect to another voltage applied to the base of said first bipolar-transistor and having a voltage different from the voltage of the input address of the defective memory cell during a read out of the address of the defective memory cell stored in said programmable ROM such that said second bipolar-transistor being turned ON or OFF according to the stored address of the defective memory cell.

2. A semiconductor memory device according to claim 1, wherein the voltage applied to the base of said first bipolar-transistor at the time of reading out the address of said defective memory cell stored in said programmable ROM is lower than the voltage applied to the base of said first bipolar-transistor during a normal operation, the voltage applied to the base of said first bipolar-transistor being between high and low voltages of the input address signal applied to the base of said second bipolar-transistor from said programmable ROM.

3. A semiconductor memory device according to claim 1, wherein said first and second bipolar-transistors are provided for each bit of the output address signal from said programmable ROM.

4. A semiconductor memory device according to claim 1, further comprising a diode for adjusting an electric potential level, wherein the base of said second bipolar-transistor is connected to the output terminal of said programmable ROM through said diode.

5. A semiconductor memory device according to claim 1, further comprising a diode for adjusting an electric potential level, wherein the emitter of said second bipolar-transistor is connected to the emitter of said first bipolar-transistor through said diode.

6. A semiconductor memory device according to claim 1, further comprising a capacitor operatively connected between the base of said second bipolar-transistor and said first power supply line.

7. A semiconductor memory device connected to receive an input address signal and having a redundancy configuration, said semiconductor device comprising:

a first power supply line;

a second power supply line having a lower voltage than that of said first power supply line;

an input-buffer circuit including:

an input terminal operatively connected to receive an external input signal;

a first bipolar-transistor having a base operatively connected to said input terminal, a collector operatively connected to said first power supply line, and an emitter; and a constant current source operatively connected between the emitter of said first bipolar-transistor and said second power supply line;

a decoder means operatively connected to receive the input address signal and decoding the input address signal;

a programmable ROM for storing an address of a defective memory cell in said memory cell array, said programmable ROM having an output terminal for outputting the address of the defective memory cell;

comparison circuit means, operatively connected to the output terminal of said programmable ROM, and to the input terminal of said input-buffer circuit, for comparing the address of the defective memory cell and the input address signal for detecting an access to the defective memory cell;

a redundancy memory cell, operatively connected to said comparison circuit means, accessed in place of the defective memory cell in response to the detection of the access to the defective memory cell by said comparison circuit; and a second bipolar-transistor having a base operatively connected to the output terminal of the programmable ROM, a collector operatively connected to said first power supply line, and an emitter operatively connected to the emitter of said first bipolar transistor, said first bipolar-transistor, said second bipolar-transistor and said constant current source forming a current switch circuit, a voltage on the base of said second bipolar-transistor being adjusted with respect to a voltage of an external input signal applied to the base of the first bipolar-transistor during the normal operation such that said second bipolar-transistor is turned OFF regardless of the external input signal, and the voltage on the base of said second bipolar-transistor being adjusted with respect to another voltage applied to the base of said first bipolar-transistor having a different voltage from the external input signal voltage during the normal operation of reading out the address of the defective memory cell stored in said programmable ROM such that said second bipolar-transistor is turned ON or OFF according to the stored address of the defective memory cell.

8. A semiconductor memory device according to claim 7, further comprising a capacitor operatively connected between the base of said second bipolar-transistor and said first power supply line.

* * * * *